United States Patent [19]

Reimer

[11] Patent Number: 4,498,717
[45] Date of Patent: Feb. 12, 1985

[54] PRINTED WIRING BOARD INTERCONNECT ARRANGEMENT

[75] Inventor: William A. Reimer, Wheaton, Ill.

[73] Assignee: GTE Communication Systems Corp., Northlake, Ill.

[21] Appl. No.: 527,636

[22] Filed: Aug. 29, 1983

[51] Int. Cl.³ .............................................. H01R 9/09
[52] U.S. Cl. .............................. 339/17 LM; 339/17 M
[58] Field of Search ....................... 339/17 LM, 17 M; 361/412, 413, 414, 415

[56] References Cited

U.S. PATENT DOCUMENTS

| | | | |
|---|---|---|---|
| 2,955,236 | 10/1960 | Luhn | 339/17 M |
| 3,378,730 | 4/1968 | Poehls | 361/413 |
| 3,430,182 | 2/1969 | Blanche | 339/17 M |
| 3,697,815 | 10/1972 | Grant et al. | 361/415 |
| 4,237,546 | 12/1980 | Wells | 361/413 |

FOREIGN PATENT DOCUMENTS 2320202 11/1974 Fed. Rep. of Germany ........ 339/17 LM Primary Examiner—John McQuade

[57] ABSTRACT

An arrangement of mounting printed wiring boards providing reduced backplane conductor congestion. The printed wiring boards are mounted in columns and interconnected within a column by conductors on interconnect planes. Connections between interconnect planes and between external terminations and the interconnect planes are accomplished by conductors on backplanes which connect to the interconnect planes. Congestion of backplane conductors is avoided by routing connections, not terminating to external points, directly from one interconnect plane to another interconnect plane by means of conductors on a cross-connect board connecting the two interconnect planes. The arrangement also includes a column between the backplane and the printed wiring boards which are mounted at an angle to the horizontal. Air flows through this column to cool the printed wiring boards by means of convection.

23 Claims, 1 Drawing Figure

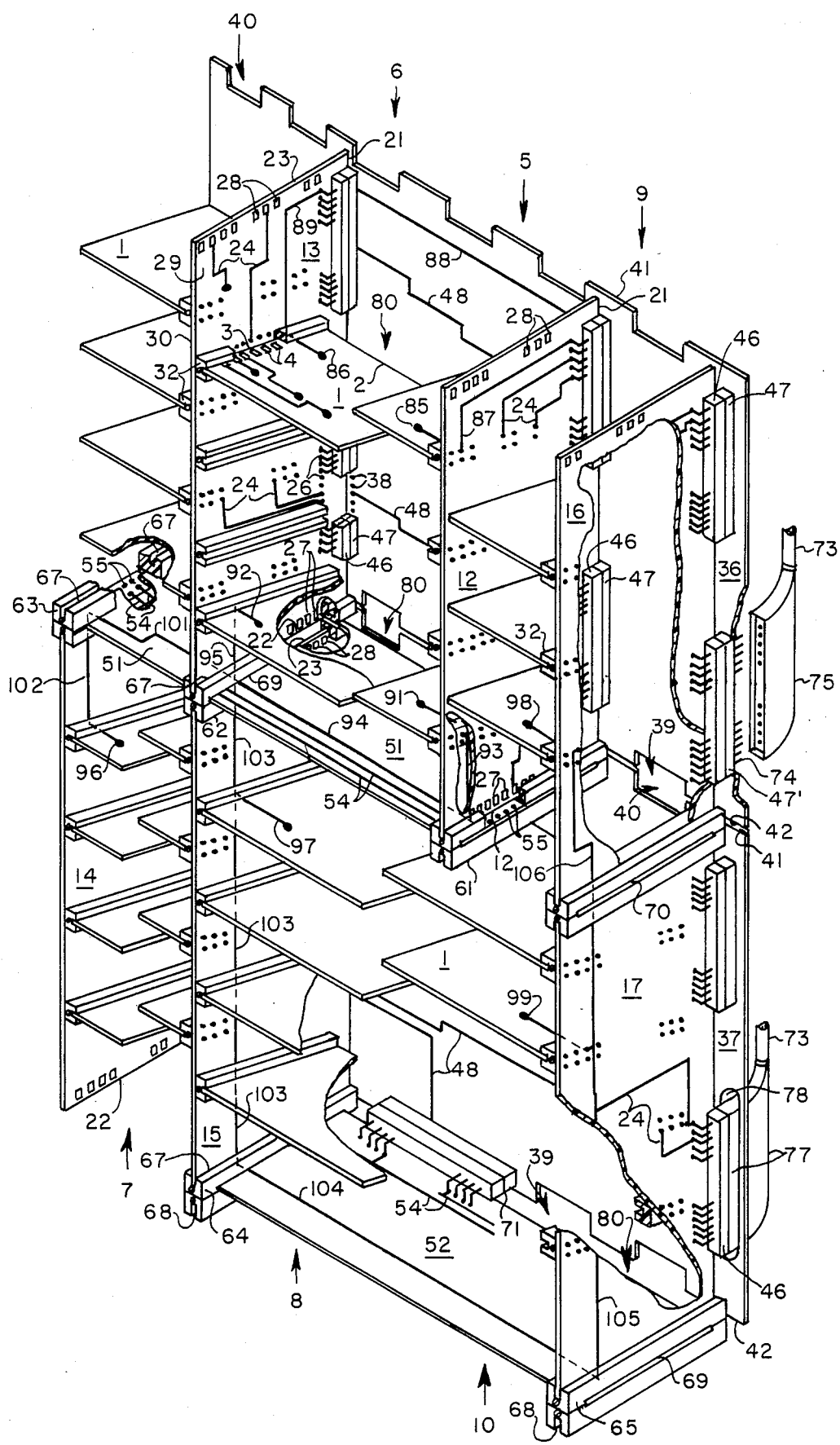

PRINTED WIRING BOARD INTERCONNECT ARRANGEMENT

CROSS-REFERENCES TO RELATED APPLICATIONS

Related, commonly assigned, co-pending applications include "Printed Wiring Board File," Ser. No. 527,635, "Double File Printed Wiring Board," Ser. No. 527,634, "Low Insertion Force Connection Arrangement," Ser. No. 527,637, "Low Insertion Force Connection Arrangement," Ser. No. 527,638 and "Low Insertion Force Connection Arrangement," Ser. No. 527,639, all filed concurrently herewith.

BACKGROUND OF THE INVENTION

The present invention relates to arrangements for interconnecting printed wiring boards, and more particularly to an arrangement for interconnecting printed wiring boards by one of their edges.

Printed wiring board interconnect arrangements are well known to those skilled in the art. One type employs four vertical supports located at the corners of a vertical column. Three mother boards are mounted between different pairs of supports in such a manner as to enclose three of the four vertical sides of the column. Horizontally oriented connectors are attached to the mother boards at fixed vertical intervals. The fourth side is retained free of obstruction to permit the insertion of printed wiring boards in the connectors. Printed wiring boards mounted in this manner form a vertical stack of horizontally oriented printed wiring boards. Such an arrangement, while operating generally satisfactorily, is limited in its ability to route connections between printed wiring boards when the quantity of printed wiring boards is large since all connections between printed wiring boards must be made via the mother boards.

Another type of printed wiring board interconnect arrangement employs a plurality of printed wiring board mounting cages mounted in a frame. Each cage includes a plurality of upper and lower printed wiring board guide pairs and a corresponding plurality of connectors mounted vertically across the back of the cage. Each printed wiring board is mounted within an upper and lower guide pair and is engaged by a corresponding connector. Printed wiring boards are connected within a cage and between cages in a frame by wiring interconnecting the printed wiring board connectors. Such an arrangement, while operating generally satisfactorily, does not easily permit the use of backplanes employing printed wiring conductors to interconnect the connectors due to the lengths of conductors required.

A third type of printed wiring board interconnect arrangement includes a plurality of printed wiring boards mounted parallel to each other and grouped within files mounted in a frame. The printed wiring boards within a file are interconnected by means of a printed wiring backplane which interconnects and mounts connectors which in turn engage the printed wiring boards. Connection between printed wiring boards in different files within a frame and between frames is accomplished by means of connector terminated cables terminating on the printed wiring boards. Such an arrangement, while operating generally satisfactorily, requires the disconnection and reconnection of cables when the printed wiring boards are replaced.

The present invention overcomes these problems by providing a new and improved arrangement for interconnecting printed wiring boards.

SUMMARY OF THE INVENTION

In accordance with the present invention, a printed wiring board interconnnect arrangement is provided. This printed wiring board interconnect arrangement includes a plurality of printed wiring boards arranged in at least first and second columns. The printed wiring boards within each column each include a first edge, each of the edges within a column lying in a common plane. The present invention also includes at least first and second interconnect planes, each interconnect plane including at least a first and a second edge. The interconnect plane first edges lie in a common plane, and the interconnect plane second edges lie in a common plane. The interconnect planes are each positioned adjacent to a corresponding one of the printed wiring board edge common planes, and interconnect the printed wiring boards within each of the columns. The printed wiring board interconnect arrangement further includes a backplane positioned adjacent to the interconnect plane first edges and connecting the interconnect planes. The printed wiring board interconnect arrangement finally includes at least one cross-connect board. The cross-connect board is positioned adjacent to the interconnect plane second edges and connects the interconnect planes.

BRIEF DESCRIPTION OF THE DRAWING

The single FIGURE of the accompanying drawing is a perspective view of a preferred embodiment of the subject invention emphasizing the electrical aspects of the subject invention.

DESCRIPTION OF THE PREFERRED EMBODIMENT

Referring now to the FIGURE of the accompanying drawing, there is shown an arrangement for interconnecting a plurality of printed wiring boards 1 in accordance with the present invention. Each of the printed wiring boards 1 is of planar construction and includes a rear edge 2, a side edge 3, and a plurality of connector terminals 4 adjacent to the side edge 3. The printed wiring boards 1 are arranged in a plurality of columns 5 through 10. The printed wiring boards 1, within each column, are arranged with their side edges 3 residing in a common plane and the rear edges 2 residing in a common plane. A plurality of interconnect planes, 12 through 17 (12-17), are included and positioned adjacent to the side edges 3 of a respective one of the printed wiring board columns 5 through 10.

Each of the interconnect planes 12-17 includes a rear edge 21, a lower edge 22, an upper edge 23, and a plurality of printed wiring conductors 24. Each of the interconnect planes 12-17 also includes a plurality of connector terminals 26 adjacent to the rear edge 21, a plurality of connector terminals 27 adjacent to the lower edge 22, and a plurality of connector terminals 28 adjacent to the upper edge 23. Each of the interconnect planes 12-17 further includes a right side surface 29, a left side surface 30, and a plurality of printed wiring board connectors 32 each attached to one or the other of the side surfaces 29 or 30.

The present invention further includes an upper backplane 36 and a lower backplane 37. Each of the backplanes 36 and 37 includes a plurality of terminals 38 proximate to the rear edges 21 of the interconnect planes 12–17, and a plurality of lower notches 39 and upper notches 40 formed in the backplane lower edges 42 and the backplane upper edges 41, respectively.

A plurality of connectors each including a connector plug 46 and a connector receptacle 47, are included in the present invention to connect the interconnect planes 12–17 to the backplanes 36 and 37. In this regard, the connector plug 46 is affixed to the interconnect plane 13 adjacent to its rear edge 21 and connected to the printed wiring conductors 24 via the terminals 26. The connector receptacles 47 are attached to backplane 35 and connected to the backplane terminals 38. The backplanes 36 and 37 further include a plurality of printed wiring conductors 48 connecting the backplane terminals 38 together in a predetermined manner.

The present invention further includes an upper cross-connect board 51 and a lower cross-connect board 52. The cross-connect boards 51 and 52 include a plurality of printed wiring conductors 54 and a plurality of terminals 55. The terminals 55 are connected to the printed wiring conductors 54 and are formed on the cross-connect boards 51 and 52 adjacent to the upper edges 23 and the lower edges 22 of the interconnect planes 12–17.

The present invention also includes cross-connect board connectors 61 through 65 (61–65). Each of the cross-connect board connectors 61–65 includes an upper interconnect plane receiving cavity 67, a lower interconnect plane receiving cavity 68, and a cross-connect board receiving slot 69. The cross-connect board connectors 61–65 are attached to the cross-connect boards 51 and 52 and are connected to the cross-connect board terminals 55. The connectors 61–65 engage the interconnect plane lower edges 22 via the upper connector cavities 67, and engage the interconnect plane upper edges 23 via the lower connector cavities 68 to connect the interconnect planes 12–17 to the cross-connect boards 51 and 52.

According to the present invention, an upper interconnect plane may be connected (or spliced) to a lower interconnect plane lying in the same plane as the upper interconnect plane through the use of a splice connector. In this regard, the terminals 27 adjacent to the lower edge 22 of the upper interconnect plane 16 may be connected to corresponding ones of the terminal 28 adjacent to the upper edge 23 of the lower interconnect plane 17 through the use of a splice connector 70.

A connector 71 is included at predetermined locations, according to the present invention, to connect the cross-connect board printed wiring conductors 54 directly to the backplane printed wiring conductors 48.

The printed wiring board interconnect arrangement of the present invention may be connected to external terminations via cables 73. In this regard, a backplane receptacle 47' including plurality of elongated pins 74 is provided at a predetermined location. A cable connector 75 is then attached to one of the cables 73 and engaged with the connector receptacle pins 74 to connect the backplane printed wiring conductors 48 to external terminations. Alternately, the printed wiring conductors 24 of the interconnect planes 12–17 may be connected directly to external terminations via one of the cables 73 by omitting the receptacle 47 (or 47') of backplane connector at a predetermined location and connecting a cable connector 77 directly to the backplane connector plug 46 through a hole 78 in the backplane 37.

Other arrangements of connection to external terminations may be realized, according to the present invention. For example, the plug 46 or optionally plug 46 and receptacle 47' may be omitted at a predetermined location retaining the elongated pins 74 to provide access to the backplane printed wiring conductors 48. The cable 73 via cable connector 75 may then be connected to the pins 74 to thus provide access to external terminations from the backplane conductors 48.

The rear edges 21 of interconnect planes 12–17 extend beyond the printed wiring board rear edges 2 to space the backplanes 36 and 37 apart from the printed wiring board rear edges 2 and thus form a plurality of air columns 80 therebetween. In addition, the printed wiring board connectors 32 are affixed to the interconnect planes 12–17 to position the printed wiring boards 1 at an angle to the horizontal sloping upward away from their rear edges 2. In operation, the printed wiring boards 1 are prevented from overheating by convection currents set up in the air above each of the printed wiring boards 1. The convection currents draw cool air through the notches 39 and 40, up the columns 80, and past the printed wiring boards 1 to cool them. Alternately, the printed wiring boards 1 may be positioned at an opposite angle to the horizontal sloping upward toward their rear edges 2 to discharge heated air flowing past the printed wiring boards 1 to the column 80 and thence from to be expelled out the notches 39 and 40 in backplanes 36 and 37.

Points on printed wiring boards in different columns in the present invention may be connected in a conventional manner by routing the connection through the interconnect planes associated with each printed wiring board and the backplane connecting the interconnect planes. In this regard, a point 85 on the printed wiring board 1 in the column 5 may be conventionally connected to a point 86 on the printed wiring board 1 in the column 6 by means of a conductor 87 on the interconnect plane 12, a conductor 88 on the backplane 36, and a conductor 89 on the interconnect plane 13. It will be appreciated that if all connections going between the printed wiring boards 1 in different columns were to be routed through the backplanes 36 and 37 in addition to all connections to external terminations, congestion of printed wiring conductors in the backplane could result.

Congestion of the printed wiring conductors on the backplanes 36 and 37 is avoided, according to the present invention, by routing the connections via an alternate path directly from one interconnect plane to another interconnect plane through a cross-connect board. In this regard, a point 91 on the printed wiring board 1 in the column 5 may be connected to a point 92 on the printed wiring board 1 in the column 6 by a conductor 93 on the interconnect plane 12, a conductor 94 on the cross-connect board 51, and a conductor 95 on the interconnect plane 13.

In like manner, similar points on several different printed wiring boards may be connected by a common bus without the need of routing bus conductors through any of the backplanes. In this regard, the points 91 and 92 may be connected in a common bus also including a point 96 on the printed wiring board 1 in the column 7, a point 97 on the printed wiring board 1 in the column 8, a point 98 on the printed wiring board 1 in the column 9, and a point 99 on the printed wiring board 1 in the column 10. The above mentioned points may be connected by adding to those previously recited conductors, a conductor 101 on the cross-connect board 51, a conductor 102 on the interconnect plane 14, a conductor 103 on the interconnect plane 15, a conductor 104 on the cross-connect board 52, a conductor 105 on the interconnect plane 17, and a conductor 106 on the interconnect plane 15.

It will now be apparent that a printed wiring board interconnect arrangement has been described hereinabove which offers significant advantages over prior art arrangements. The arrangement, by virtue of the added cross-connect board, frees the backplane from the burden of carrying all connections between interconnect planes and thus prevents the attendant congestion of conductors which could therefrom result. Further, the positioning of the printed wiring boards and backplane provides a natural means of cooling (e.g. by means of convection) the printed wiring boards.

The present invention has been described with reference to specific embodiments thereof for the purpose of illustrating the manner in which the invention may be used to advantage. It will be appreciated by those skilled in the art that numerous modifications of the present invention can be made without departing from the spirit of the invention which shall be limited only by the scope of the claims appended hereto.

What is claimed is:

1. A printed wiring board interconnect arrangement comprising:
   a plurality of printed wiring boards arranged in at least first and second columns, each of said printed wiring boards, within each column, including at least a first edge, said edges within a column lying in a common plane;
   at least first and second interconnect planes, each interconnect plane including at least a first and a second edge, said interconnect plane first edges lying in a common plane, said interconnect plane second edges lying in a common plane, each of said interconnect planes positioned adjacent to a corresponding one of said printed wiring board edge common planes, and interconnecting said printed wiring boards having edges in said corresponding common plane;
   a backplane positioned adjacent to said interconnect plane first edges and connecting said interconnect planes; and
   at least one cross-connect board, positioned adjacent to said interconnect plane second edges and connecting said interconnect planes.

2. An arrangement as claimed in claim 1, wherein: said interconnect planes are parallel to each other.

3. An arrangement as claimed in claim 1, wherein: said interconnect plane first and second edges are not coincident.

4. An arrangement as claimed in claim 3, wherein: said first and second edges are perpendicular to each other.

5. An arrangement as claimed in claim 1, wherein: said printed wiring boards each include a plurality of connector terminals positioned adjacent to said first edge; said interconnect planes each include at least one side and a plurality of printed wiring conductors; and said arrangement includes a plurality of printed wiring board connectors; said printed wiring board connectors attached to said interconnect plane side, connected to said interconnect plane printed wiring conductors, and engaging said printed wiring board terminals to connect said printed wiring boards to said interconnect plane.

6. An arrangement as claimed in claim 5, wherein: said printed wiring board connectors are of the zero-insertion-force type.

7. An arrangement as claimed in claim 1, wherein: each of said interconnect planes includes a plurality of printed wiring conductors and a plurality of terminals positioned adjacent to said first edge; said backplane includes a plurality of printed wiring conductors and a plurality of terminals positioned proximate to each of said interconnect plane first edges; and said arrangement includes backplane connectors; said interconnect plane terminals connected to said interconnect plane printed wiring conductors, said backplane terminals connected to said backplane printed wiring conductors, and said backplane connectors connecting said interconnect plane terminals to said backplane terminals.

8. An arrangement as claimed in claim 7, wherein: each of said backplane connectors includes a first receptacle attached to said backplane, connected to said backplane terminals, and engaged with said interconnect plane terminals.

9. An arrangement as claimed in claim 8, wherein: each of said backplane connectors includes at least a first plug, said first plug attached to at least one of said interconnect planes, connected to said interconnect plane terminals, and engaged with an associated one of said first receptacles.

10. An arrangement as claimed in claim 1, wherein: each of said cross-connect boards includes a plurality of printed wiring conductors, each of said interconnect planes includes a plurality of printed wiring conductors and a plurality of terminals positioned adjacent to said interconnect plane second edge, said cross-connect board includes at least two pluralities of terminals each positioned proximate to an associated one of at least two of said interconnect plane second edges, and said arrangement includes at least two cross-connect board connectors; said interconnect plane second edge terminals connected to associated ones of said interconnect plane printed wiring conductors, said cross-connect board printed wiring conductors connected between associated pairs of said cross-connect board terminals, and each of said two cross-connect board connectors connecting an associated one of said two pluralities of interconnect plane second edge terminals to an associated one of said two pluralities of cross-connect board terminals.

11. An arrangement as claimed in claim 10, wherein: said two cross-connect board connectors are attached to said cross-connect board, connected to said associated cross-connect board terminals, and engaged with said associated interconnect plane second edge terminals.

12. An arrangement as claimed in claim 11, wherein: each of said cross-connect board connectors includes a first board receiving cavity, said cavity receiving said associated interconnect plane second edge to engage said cross-connect board connector with said associated interconnect plane second edge terminals.

13. An arrangement as claimed in claim 1, wherein: said arrangement includes a plurality of printed wiring boards arranged in a third column, each of said printed wiring boards within said third column, including at least a first edge, said first edges lying in a common plane;
   said arrangement further includes a third interconnect plane including a first and a second edge, said third interconnect plane first edge lying in the same plane as said first and said second interconnect plane first edges, said third interconnect plane second edge lying in the same plane as said first and said second interconnect plane second edges; and said cross-connect board is further positioned adjacent to said third interconnect plane second edge and connects said third interconnect plane to at least one other of said interconnect planes.

14. An arrangement as claimed in claim 13, wherein: said third interconnect plane is parallel to said first interconnect plane and in the alternative parallel to said second interconnect plane.

15. An arrangement as claimed in claim 14, wherein: said third interconnect plane first and second edges are not coincident.

16. An arrangement as claimed in claim 15, wherein: said third interconnect plane first and second edges are perpendicular to each other.

17. An arrangement as claimed in claim 13, wherein: said third interconnect plane includes a plurality of printed wiring conductors and a plurality of terminals positioned adjacent to said third interconnect plane second edge, said cross-connect board includes a plurality of printed wiring conductors and a plurality of terminals positioned proximate to said third interconnect plane second edge, said third interconnect plane second edge terminals being connected to said third interconnect plane printed wiring conductors, said cross-connect board terminals proximate to said third interconnect plane second edge being connected to said cross-connect board printed wiring conductors, and said third interconnect plane second edge terminals being connected to said cross-connect board terminals to connect said third interconnect plane to at least one of said other interconnect planes.

18. An arrangement as claimed in claim 17, wherein: said arrangement includes a cross-connect board connector, said connector being attached to said cross-connect board, being connected to said terminals adjacent to said third interconnect plane second edge, and including a first and a second cavity, said second interconnect plane second edge being received within said second interconnect plane connector cavity and said third interconnect plane second edge being received within said first interconnect plane connector cavity to connect said second and said third interconnect planes to said first interconnect plane.

19. An arrangement as claimed in claim 17, wherein: said arrangement includes a cross-connect board connector, said connector being attached to said cross-connect board, being connected to said terminals adjacent to said third interconnect plane second edge, and including a first cavity, said third interconnect plane second edge received within said first interconnect plane connector cavity to connect said third interconnect plane to at least one other of said interconnect planes.

20. An arrangement as claimed in claim 1, wherein: said printed wiring boards each include a second edge, said printed wiring board second edges within a column all residing in a common plane, and said interconnect plane second edges extending beyond said printed wiring board second edges to space apart said backplane from said printed wiring board second edges and thus form a column through which air may pass to cool said printed wiring boards.

21. An arrangement as claimed in claim 20, wherein: said printed wiring boards are inclined at an angle to the horizontal, said inclined angle setting up convection currents in the air above each printed wiring board as said air is heated by said printed wiring boards to draw air from or to discharge air to said air column to cool said printed wiring boards.

22. An arrangement as claimed in claim 1, wherein: said arrangement further includes a direct connector, said direct connector connecting said cross-connect board directly to said backplane.

23. An arrangement as claimed in claim 1, wherein: said arrangement includes third and fourth interconnect planes and a bridging connector, said third and fourth interconnect planes positioned adjacent to said backplane and adjacent to each other in a common plane, said bridging connector connecting said third and fourth interconnect planes.

* * * * *